United States Patent [19]

Paine

[11] Patent Number: 4,617,639

[45] Date of Patent: Oct. 14, 1986

[54] HOUR METER APPARATUS AND METHOD

[75] Inventor: John C. Paine, Chardon, Ohio

[73] Assignee: Caterpillar Industrial Inc., Mentor, Ohio

[21] Appl. No.: 638,913

[22] Filed: Aug. 8, 1984

[51] Int. Cl.⁴ .................. G06F 15/20; G08B 19/00; B60Q 1/00

[52] U.S. Cl. .................. 364/569; 364/424; 377/20; 340/52 D

[58] Field of Search ............ 364/569, 144, 143, 424, 364/551; 377/20; 340/52 D, 52 R

[56] References Cited

U.S. PATENT DOCUMENTS

| | | | |
|---|---|---|---|
| 4,003,019 | 1/1977 | Tronel | 340/52 F |
| 4,031,363 | 6/1977 | Freeman et al. | 235/150.2 |
| 4,142,238 | 2/1979 | Brandt et al. | 364/569 X |
| 4,159,531 | 6/1979 | McGrath | 364/900 |
| 4,168,525 | 9/1979 | Russell | 364/569 |
| 4,296,409 | 10/1981 | Whitaker et al. | 364/551 X |
| 4,319,319 | 3/1982 | Wygant | 364/143 |
| 4,371,922 | 2/1983 | Fujita et al. | 364/144 |
| 4,404,641 | 9/1983 | Bazarnik | 364/569 |
| 4,533,900 | 8/1985 | Muhlberger et al. | 364/569 X |
| 4,539,632 | 9/1985 | Hansen et al. | 364/569 X |

Primary Examiner—Edward J. Wise
Attorney, Agent, or Firm—Stephen L. Noe

[57] ABSTRACT

Electronic hourmeter devices having non-volatile memories are useful, for example, in industrial vehicles. Advantageously, such non-volatile memories should be free from a need for battery back-up systems and should minimize the number of changes of the internal memory registers. The subject electronic hourmeter apparatus includes both a dynamic memory device and a non-volatile memory device. Data is maintained in each of the memory devices and memory bit changes are minimized by utilizing a gray coded binary representation of a portion of the data and by systematically altering the addressed memory location of a portion of the data in response to one of the stored data values. Data storage occurs both periodically and in response to disconnection of the vehicle battery. Thus, the disclosed electronic hourmeter apparatus 10 advantageously maintains the integrity of the stored data, minimizes the number of bit changes that occur in the non-volatile memory device, and avoids the need for a battery back-up.

14 Claims, 5 Drawing Figures

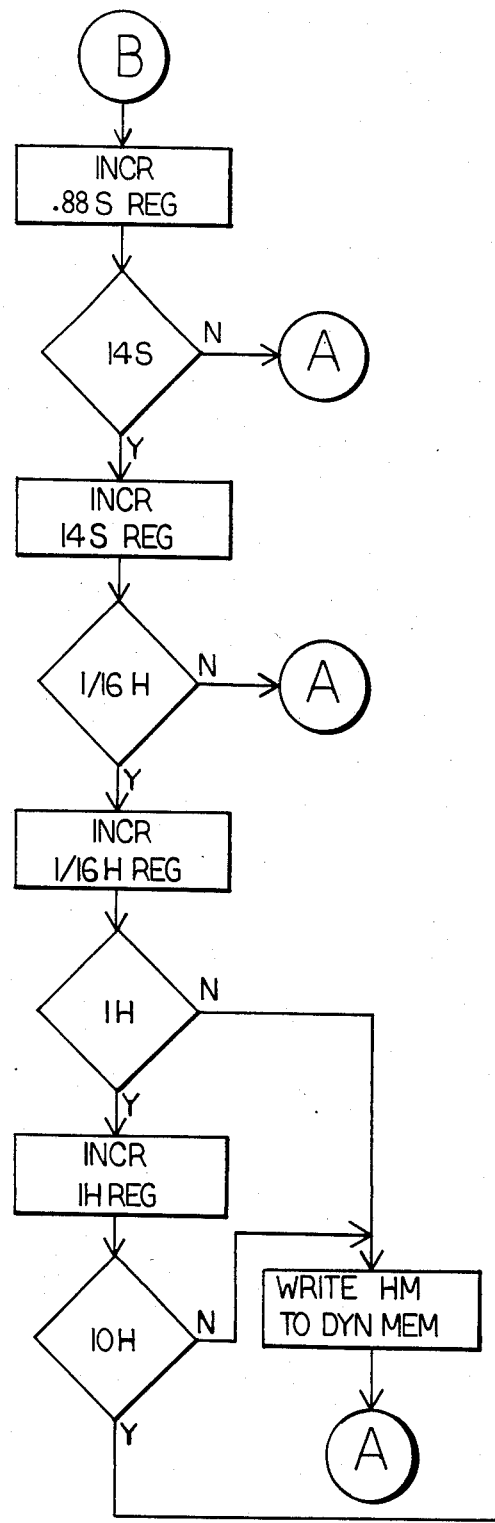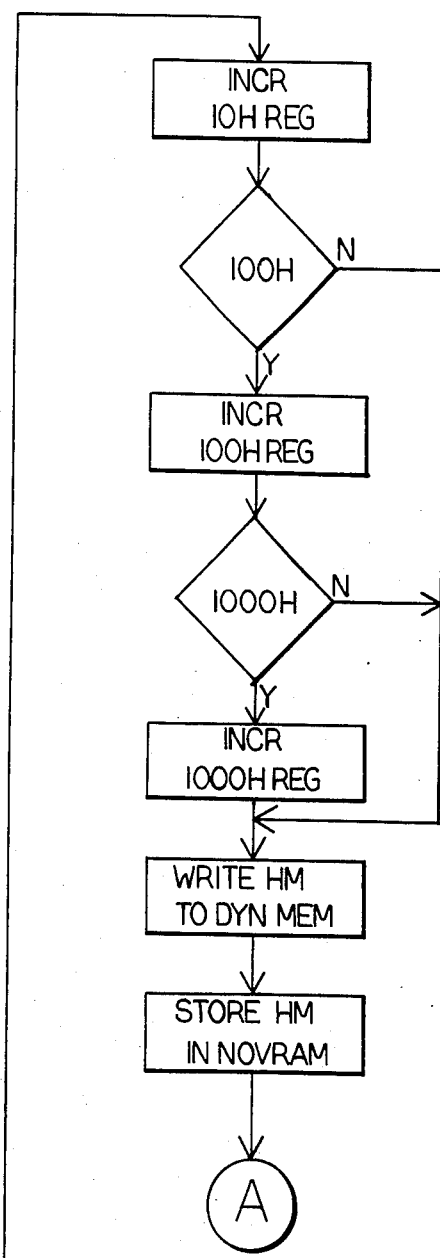
FIG. 5

HOUR METER APPARATUS AND METHOD

DESCRIPTION

1. Technical Field

This invention relates generally to an apparatus and method for measuring, the period of time a predetermined operating condition exists, and, more particularly, to an apparatus and method for measuring, storing, and displaying the accumulated period of time a vehicle is in operation.

2. Background Art

Hourmeters of various types are commercially available and are in common use today. These devices frequently include electromagnetic counters. In response to the occurrence of a particular operating condition, for example, the energization of a vehicle such as an industrial lift truck, a time base of conventional design periodically increments the electromechanical counter to display successive digital values. Such electromechanical devices inherently accumulate and store the total amount of time the sensed condition occurs. However, such devices are essentially mechanical, suffer from the high failure rates often associated with mechanical devices, and are expensive to manufacture and repair.

Fully electronic hourmeters have been developed in order to attain improved reliability. Such electronic hourmeters typically measure and accumulate the period of time over which a particular operating condition exists, display the accumulated time on a digital display device, and store this period of time in some type of memory. However, typical memory devices capable of repeated "store" and "recall" operations are dynamic and a supply voltage must be continuously applied to such dynamic memory devices or the stored data is lost. Responsively, electronic hourmeters typically include battery back-up systems and have the disadvantage that a discharged battery permits loss of accumulated data. In addition, the battery adds expense to the hourmeter device and must be periodically serviced.

Electrically alterable, non-volatile memory devices are now commercially available. Such non-volatile devices do not require a battery back-up in order to maintain the integrity of data stored therein. However, such memory devices are limited with respect to the number of successful "store" operations that can be performed per unit bit of memory, and are not normally suitable for applications requiring frequent updating of data stored, as is required for an hourmeter device.

An hourmeter device that is fully electronic in design, requires no battery back-up to maintain accumulated data in memory, and obviates the problem of excessive memory bit changes is highly desirable.

The present invention is directed to overcoming one or more of the problems as set forth above.

DISCLOSURE OF THE INVENTION

In one aspect of the present invention apparatus for measuring, storing, and displaying the accumulated period of time and intermittent operating condition of a vehicle exists is provided. The apparatus includes means for detecting the intermittent operating condition and producing a control signal in response to the detected condition. Oscillator means for producing a predetermined clock frequency signal is provided. Both a dynamic and a non-volatile memory, each having a plurality of addressable memory locations, is also provided. Processor means receives the control signal and the clock frequency signal and controllably modifies predetermined ones of a plurality of time interval registers in response to receiving the control signal and a predetermined number of cycles of the clock frequency signal. The processor means stores a representation of the contents of the time interval registers in the dynamic memory in response to each modification of a first predetermined one of the time interval registers, and transfers the contents of the dynamic memory to the non-volatile memory in response to each modification of a second predetermined one of the time interval registers.

In a second aspect of the present invention, a method for measuring, storing, and displaying the accumulated period of time an intermittent operating condition of a vehicle having a vehicle battery exists, is provided. The method includes detecting the intermittent operating condition, producing a control signal in response to the received condition, and producing a predetermined clock frequency signal. Predetermined ones of a plurality of time interval registers are modified in response to receiving both the control signal and a predetermined number of cycles of the clock frequency signal. A representation of the contents of the time interval registers is stored in the dynamic memory in response to each modification of a first predetermined one of the time interval registers, and the contents of the dynamic memory is transferred to the non-volatile memory in response to each modification of a second predetermined one of the time interval registers.

The present invention is fully electronic and stores the accumulated period of time the intermittent operating condition exists, without need for a battery back-up. The accumulated time period is stored in a non-volatile memory device, and the number of bit changes occurring in the non-volatile memory device is minimized to prolong the useful life of the device.

BRIEF DESCRIPTION OF THE DRAWINGS

For a better understanding of the present invention, reference may be made to the accompanying drawings, in which.

BEST MODE FOR CARRYING OUT THE INVENTION

Figure 1:
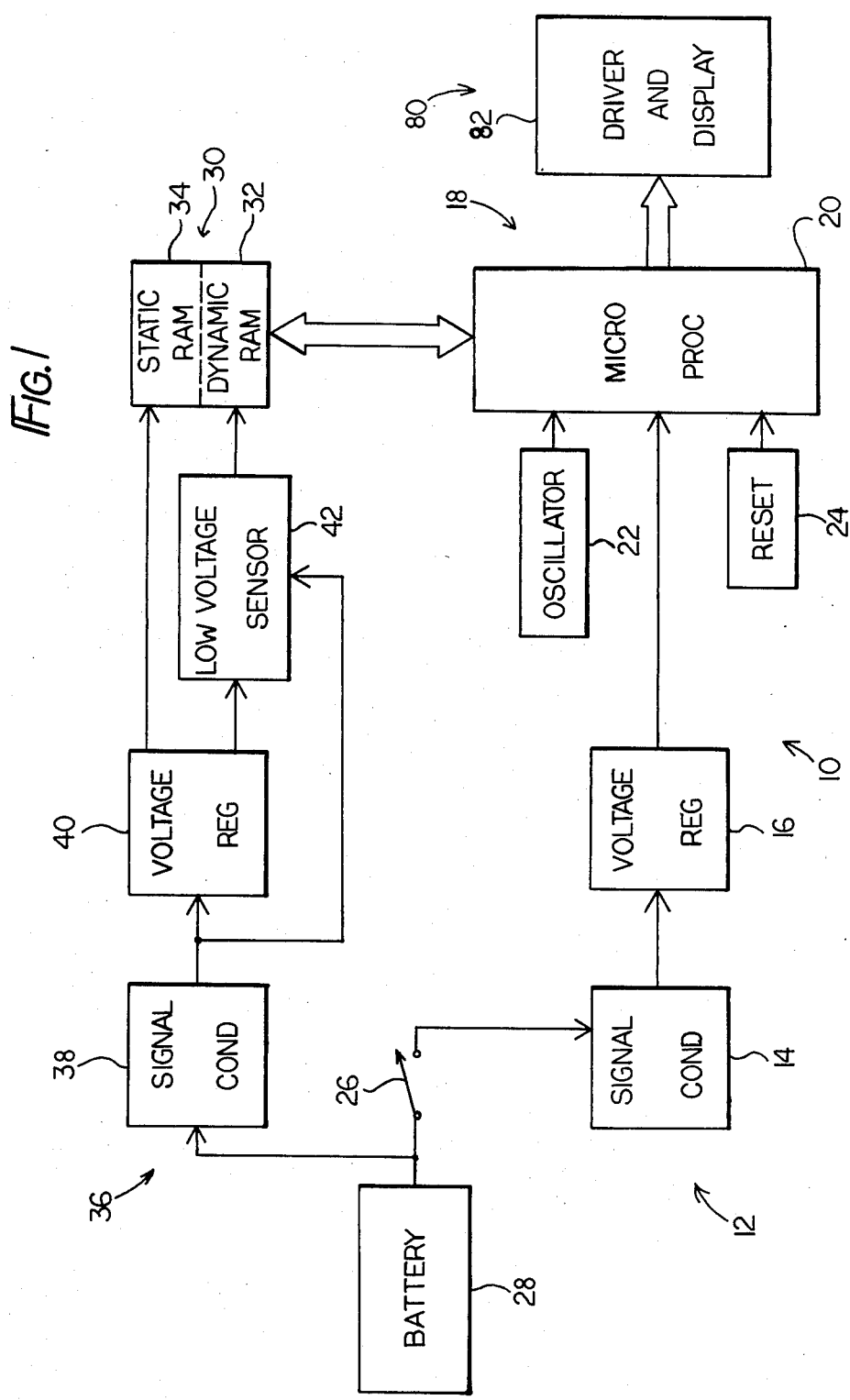
FIG. 1 is a block diagram incorporating one embodiment of the present invention.

Referring first to FIG. 1, an apparatus embodying certain of the principles of the present invention is generally indicated by the reference numeral 10. It should be understood that the following detailed description relates to the best presently known embodiment of the apparatus 10. However, the apparatus 10 can assume numerous other embodiments, as will become apparent to those skilled in the art, without departing from the appended claims.

FIG. 1 is a block diagram of one embodiment of the present invention. Means 12 for detecting an intermittent operating condition and producing a control signal in response to the detected condition includes a signal conditioner 14 connected to a voltage regulator 16. The output of the voltage regulator 16 is connected to processor means 18, for example, a microprocessor 20.

Oscillator means 22 for producing a predetermined clock frequency signal, and reset means 24, also connect to the processor means 20.

Input to the signal conditioner 14 is, for example, through a switch 26 connected to a power supply, such as a vehicle battery 28. A random access memory device 30, containing both a dynamic memory device 32 and a non-volatile memory device 34, is also connected to the processor means 18.

The vehicle battery 28 is connected directly to means 36 for sensing the vehicle battery voltage and transferring the contents of the dynamic memory 32 to the non-volatile memory 34 in response to the vehicle battery voltage being less than a predetermined magnitude. The sensing means 36 includes a second signal conditioner 38 having an input connected to the vehicle battery 28. The output of the second signal conditioner 38 is connected to the input of a second voltage regulator 40 and to one input of a low voltage sensor means 42. A first output of the second voltage regulator 40 is connected to a second input of the low voltage sensor means 42. The output of the low voltage sensor means 42 and a second output of the second voltage regulator 40 are each connected to the memory device 30.

Figure 2:
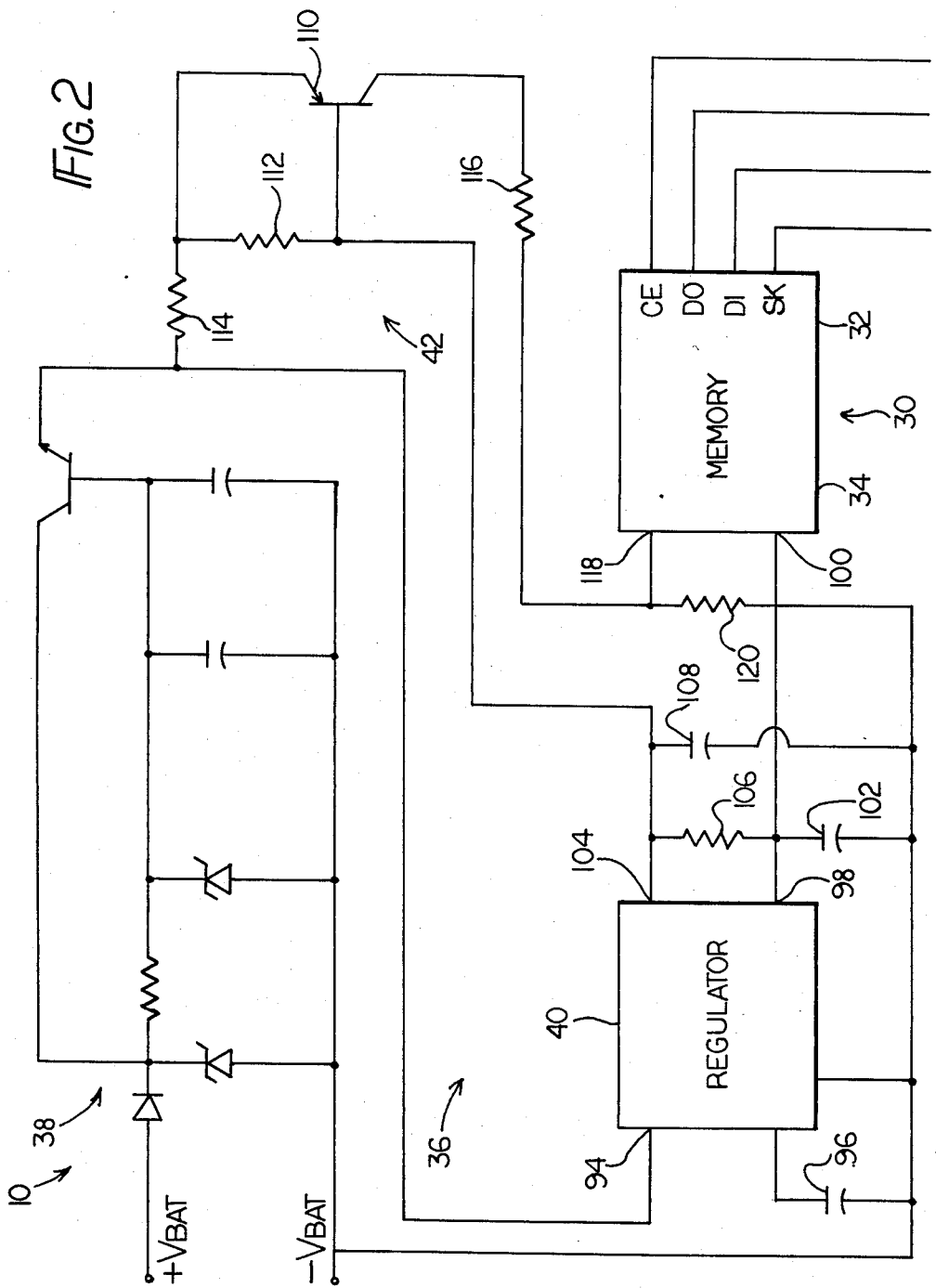
FIGS. 2 and 3 are a schematic representation of one embodiment of the present invention; and, FIGS. 4 and 5 are a flowchart of software used with one embodiment of the present invention.
Figure 3:
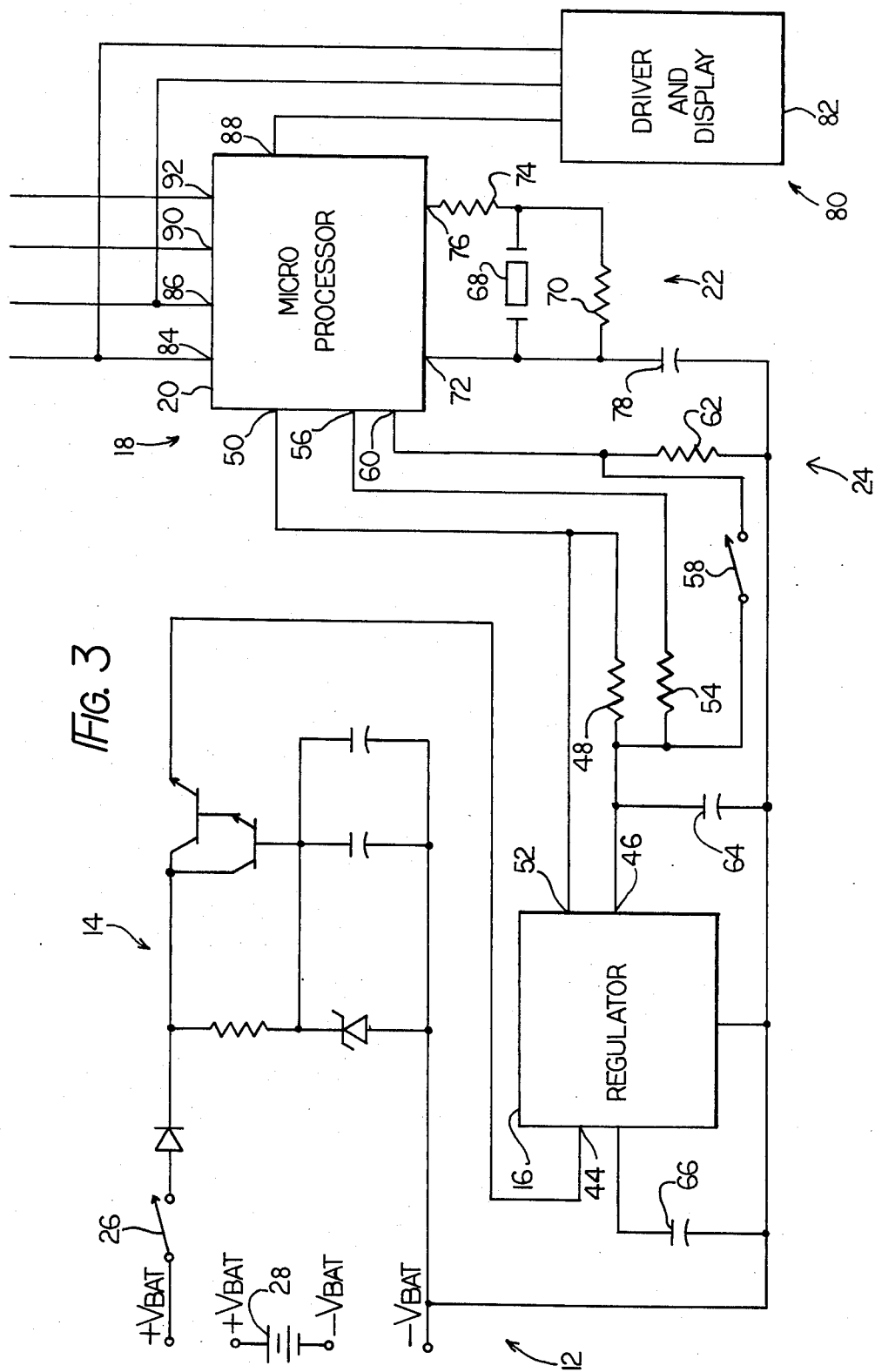

FIGS. 2 and 3 together constitute a schematic diagram of an embodiment of the present invention. Throughout the discussion of FIGS. 2 and 3, connections to the vehicle battery 28 are referred to as + and $-V_{BAT}$. In FIG. 3, the receiving means 12 includes a first signal conditioner 14 connected through a switch 26 to $+V_{BAT}$. The switch 26 is, for example, a portion of an ignition switch of the vehicle. The signal conditioner 14 is a conventional noise filtering and signal debouncing circuit.

The output of the signal conditioner 14 is delivered to an input terminal 44 of the first voltage regulator 16. The voltage regulator 16 is, for example, a model L487B manufactured by SGS-ATES Electronics of Phoenix, Ariz. An output terminal 46 of the voltage regulator 16 is connected through a resistor 48 to a "reset" terminal 50 of the processor means 18. The "reset" terminal 50 is also connected to a "reset" output 52 of the voltage regulator 16. The output terminal 46 is also connected through a resistor 54 to an input terminal 56 of the processor means 18 and through a reset switch 58 to an input terminal 60 of the processor means 18. The reset switch 58 is, for example, part of a reset means 24 and includes a resistor 62 connected to $-V_{BAT}$. A capacitor 64 is also connected from the output terminal 46 to $-V_{BAT}$, and a delay capacitor 66 is connected from a delay output terminal of the first voltage regulator 16 to $-V_{BAT}$.

The oscillator means 22 for producing a predetermined clock frequency signal includes a quartz crystal 68 connected in parallel with a resistor 70. One end of the parallel combination is connected to an input port 72 of the processor means 18 and the other end of the parallel combination is connected through a resistor 74 to a different input port 76 of the processor means 18. The input port 72 is also connected through a capacitor 78 to $-V_{BAT}$. The quartz crystal 68 is, for example, a conventional 3.58 megahertz color burst crystal.

Means 80 for controllably accessing and decoding the contents of the memory and displaying a number representing the decoded value include a driver and display device 82. A serial clock output port 84, serial output port 86, and data load port 88 of the processor means 18 are connected to the display means 80.

Referring now to FIG. 2, the serial clock and serial output ports 84,86 as well as the serial input port 90 and chip enable port 92 are connected to respective ports of the random access memory device 30. The second signal conditioner 38 of the sensing means 36 is connected to $+V_{BAT}$ and serves as a conventional signal filtering element. The output of the signal conditioner 38 is connected to an input 94 of the second voltage regulator 40. The second voltage regulator 40 is preferably of the same type as the first voltage regulator 16. A delay capacitor 96 is connected from the second voltage regulator 40 to $-V_{BAT}$.

A "reset" output terminal 98 of the second voltage regulator 40 is connected to a "recall" terminal 100 of the non-volatile memory device 34, to $-V_{BAT}$ through a capacitor 102, and to a first output terminal 104 of the second voltage regulator 40 through a resistor 106. The second output terminal 104 is connected to $-V_{BAT}$ through a capacitor 108 and to the low voltage sensor means 42.

The low voltage sensor means 42 includes a transistor 110 having a base connected to the second output terminal 104 of the second voltage regulator 40, and an emitter connected to the base through a resistor 112. The emitter of the transistor 110 is also connected to the output of the signal conditioner 38 through a resistor 114. A collector of the transistor 110 is connected through a collector resistor 116 to a "store" terminal 118 of the non-volatile memory device 34 and through a resistor 120 to $-V_{BAT}$.

The ratings, values, and manufacturers shown for various electrical elements discussed above are for exemplary purposes only. Alterations of the circuit and embodiment discussed and the use of electrical elements of different constructions or ratings will be apparent to those skilled in the art. Such alterations or substitutions can be implemented without departing from the appended claims.

INDUSTRIAL APPLICABILITY

Operation of the apparatus 10 is best described in relation to its use on a vehicle, for example, an industrial vehicle such as an electric lift truck. The switch 26 supplies battery voltage from the vehicle battery 28 to the detecting means 12 in response to closing the ignition switch of the vehicle. Responsively, a signal is delivered from the output terminal 46 of the first voltage regulator 16 through respective resistors 48,54 to ports 50,56 of the processor means 18.

The processor means 18 includes a microprocessor 20 as described above. The microprocessor 20 includes as an integral part thereof a working memory area. For the purposes of this invention, a portion of the working memory area contains a plurality of time interval registers. The processor means 18 receives the control signal and the clock frequency signal and controllably increments or modifies predetermined ones of the plurality of time interval registers in response to receiving both the control signal and a predetermined number of cycles of the clock frequency signal.

The memory device 30 includes both a dynamic random access memory device 32 and a non-volatile random access memory device 34 constructed in a single package, for example, model No. X2443PI, manufactured by XICOR of Milpitas, Calif. Owing to the construction of the non-volatile memory device 34, the contents can be changed only a limited number of times before the device becomes unworkable. Therefore, reliability of the apparatus 10 demands that provision be made for minimizing the number of times each bit of storage in the non-volatile memory device 34 is altered.

Communication between the processor means 18 and the memory device 30 always involves the dynamic memory device 32. Data is transferred to and from the non-volatile memory device 34 through the dynamic memory device 32. Data transfer is initiated either by a specific instruction from the processor means 18 or by the application of a predetermined logic signal to one of the "store" and "recall" terminals 118,100.

In the preferred embodiment, each cycle from the oscillator means 22 is counted in the internal working memory and is used to control the time keeping functions of the apparatus 10. The processor means 18 stores a representation of the contents of the time interval registers in the dynamic memory device 32 in response to each modification of a first predetermined one of the time interval registers, and transfers the contents of the dynamic memory device 32 to the non-volatile memory device 34 in response to each modification of a second predetermined one of the time interval registers. The sensing means 36 senses the vehicle battery voltage and transfers or copies the contents of the dynamic memory device 32 to the non-volatile memory device 34 in response to the vehicle battery voltage being less than a predetermined magnitude.

Both the dynamic and non-volatile portions of the memory device 30 are identically organized as 16 bit by 16 bit digital arrays. Individual time interval registers are created and maintained in the memory device 30 for a plurality of time intervals, specifically 1/16th hour, 1 hour, 10 hours, 100 hours, and 1000 hours. Each of these time interval registers is maintained in the dynamic memory device 32 and is periodically stored in the non-volatile memory device 34. A representation of the contents of at least a first one of the time interval registers is stored in both the dynamic and non-volatile memory devices 32,34 as a binary coded decimal number, and a representation of the contents of at least a second one of the time interval registers is stored in both the dynamic and non-volatile memory devices 32,34 as a gray coded binary number. Further, the addressable memory location in which at least one of the gray coded binary numbers is stored, is selected and varies systematically in response to the value of a predetermined different one of the stored numbers.

In the preferred embodiment, the 1000 hour and 100 hour time interval registers are stored as 4 bit binary coded decimal numbers in a first 8 bits of a first row of each memory device 32,34. Owing to the large number of hours represented by the 100 and 1000 hour time interval registers, there is no need to minimize the number of times these registers change over the typical operating life of an industrial vehicle. The 10 hour, 1 hour, and 1/16th hour time interval registers are stored in the memory devices 32,34 as 8 bit gray coded binary numbers. The 8 bit gray code, shown in Table 1, is designed such that each of the 8 bits changes logic state only two times during a complete counting cycle from zero through 15 and back to zero again. This is in marked contrast to the conventional binary coded decimal format in which the least significant bit changes logic state 16 times during the same 0-15-0 counting cycle.

In the preferred embodiment, the 10 hour register is stored as the second 8 bits of the first row of each of the memory devices 32,34. The 1 hour and 1/16th hour time interval registers are stored as respective 8 bit gray coded binary numbers in a second row of each of the memory devices 32,34. Owing to the fact that the latter two registers change value relatively frequently, in addition to the use of the 8 bit gray code, the row location wherein these values are stored is continually altered in response to the value of the 10 hour time interval register. Therefore, with each incremental change in the 10 hour time interval register, the instantaneous address location of the 1 hour and 1/16th hour time interval registers is responsively altered, and the number of bit changes of any single memory location in the non-volatile memory device 34 is advantageously minimized.

To further extend the life of the non-volatile memory device 34, the frequency of the "store" operation is also minimized. In order to maintain the integrity of the information of the hourmeter display information, data is sent from the processor means 18 to the dynamic memory device 32 with every incremental change of the 1/16th hour time interval register. Therefore, the dynamic memory device always contains information accurate to within 1/16th of one hour. However, "store" operations to the non-volatile memory device 34 normally occur only with each increment of the 10 hour register. Owing to the fact that the 1 hour and 1/16th hour time interval registers always represent the number zero at the time the 10 hour time interval register is incremented, no bit changes occur in the 1 hour and 1/16th hour memory locations during the "store" operation. This further minimizes the number of bit changes that occur in the, non-volatile memory device 34.

The 10 hour "store" operations are normally initiated by a command from the processor means 18. In addition, disconnection of the vehicle battery 28 automatically causes a "store" operation to be initiated by the sensing means 36. The low voltage sensor means 42 detects the loss of the $+V_{BAT}$ signal and, prior to the decay of power supplied to the memory device 30, directly causes a "store" operation to be performed by delivering a signal to the "store" input terminal 118. This is accomplished by turning "off" the transistor 110 and applying a logic 0 signal to the "store" terminal 118. Therefore, integrity of the information stored in the non-volatile memory device 34 is maintained to within at least 1/16th of 1 hour.

In response to $+V_{BAT}$ again being applied to the apparatus 10, the "reset" output terminal 98 of the second voltage regulator 40 is maintained at a logic 0 level for a period of time responsive to the value of the delay capacitor 96. This logic signal is delivered to the "recall" terminal 100 of the memory device 30, and causes the data stored in the non-volatile memory device 34 to be transferred or copied back to the dynamic memory device 32 where it is again available to the processor means 18. In like manner, a logic 0 signal is delivered from the "reset" output terminal 52 of the first voltage regulator 16 to the "reset" port 50 of the processor means 18, and causes the microprocessor 20 to be reinitialized. The respective delay capacitors 96,66 are advantageously selected such that the recall operation is completed before the microprocessor 20 is intialized, ensuring that the microprocessor 20 does not seek data from the dynamic memory device 32 before the data is available.

Figure 4:
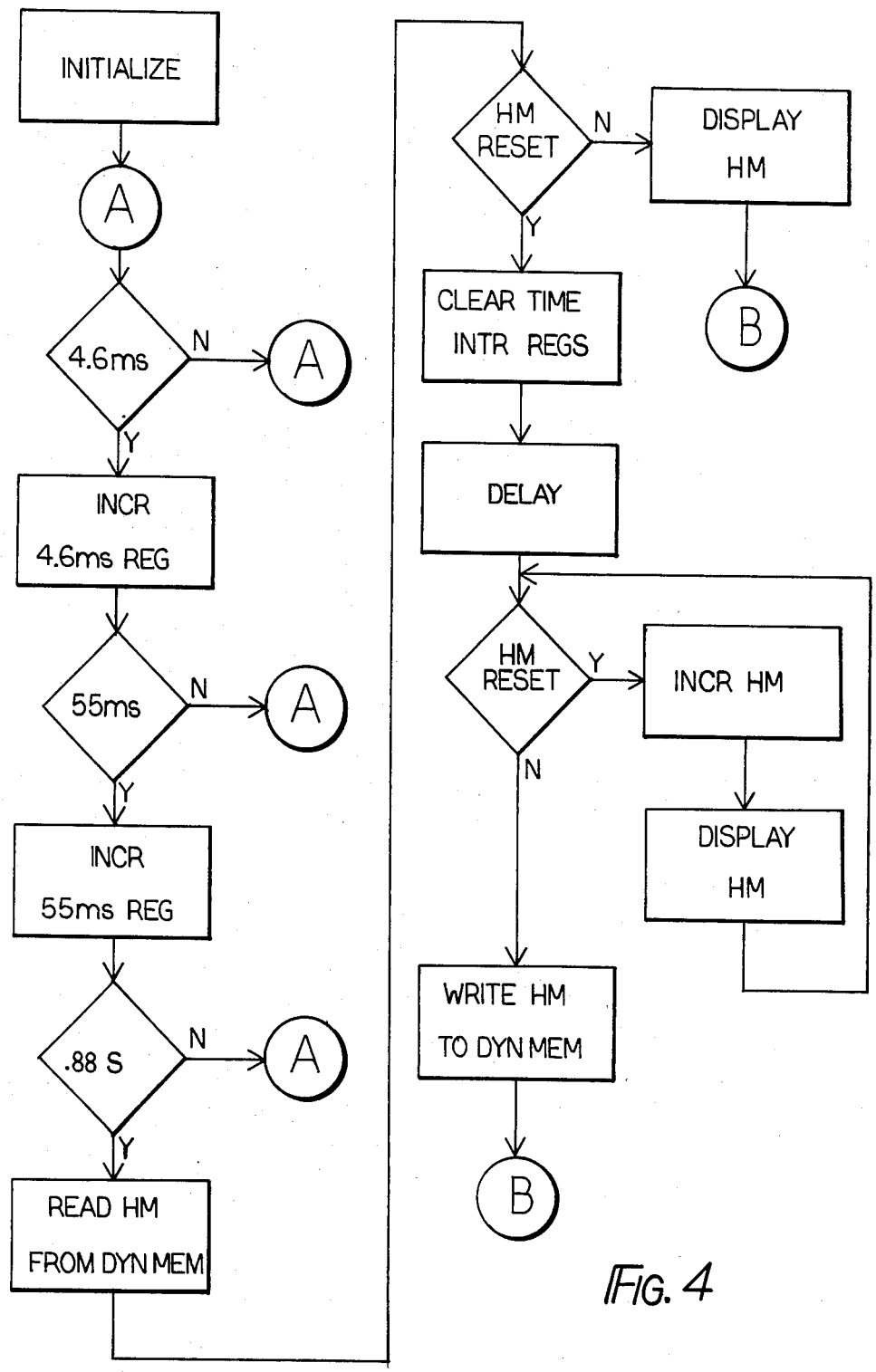

Referring now to FIGS. 4, 5, and 6, a functional flowchart defining the internal programming of the microprocessor 20 is shown. From this flowchart, a programmer of ordinary skill can develop a specific set of program instructions for a general purpose microprocessor that performs the steps necessary for implementation of the instant invention. It will be appreciated that, while the best mode of the invention is considered to include a properly programmed microprocessor, the result of which is the creation of novel hardware associations within the microprocessor and its associated devices, it is possible to implement the instant invention utilizing traditional hard wired circuits.

Upon applying power to the apparatus 10, the microprocessor 20 is initialized, for example, by the logic 0 signal from the first voltage regulator 16, retrieves the accumulated contents of the memory device 30, and begins counting clock cycles received from the oscillator means 22. These clock cycles are counted in the various internal time interval registers maintained in the working memory of the microprocessor and periodically cause overflows of successive ones of these registers. For example, the clock cycles are counted until a time interval of 4.6 milliseconds has elapsed at which time a 4.6 millisecond register is incremented. Likewise, every 55 milliseconds, a 55 millisecond register is incremented until 0.88 seconds has finally elapsed.

Every 0.88 seconds the contents of the dynamic memory 32 is read by the microprocessor 20. The reset means 24 is checked and, if no reset is being called for, the contents of the dynamic memory 34 is decoded and displayed as total elapsed hours on the display means 80. Therefore, the accumulated time is displayed 0.88 seconds after power is applied to the apparatus 10 and is updated every 0.88 seconds thereafter.

In similar fashion, the 0.88 second register is incremented, as is a 14 second register, until 1/16th hour elapses. As discussed above, the time interval registers representing 1/16th hour and greater are maintained in both the dynamic and non-volatile memory devices 32,34. After incrementing the 1/16th hour register, the 1 hour interval is checked and the 1/16th through 1000 hour registers are each stored in the dynamic memory device 32. If 1 hour has elapsed, the 1 hour register is incremented, a test is made to determine whether 10 hours has elapsed, and each of the registers is stored in the dynamic memory device 32.

If 10 hours has elapsed, in the preferred embodiment, the contents of each of the 1/16th through 1000 hour registers is stored in the non-volatile memory device 34. Therefore, when the 10 hour test is true, the 10 hour register is incremented and the 100 hour test performed. Regardless of the outcome of the 100 hour test, the contents of each of the registers is stored first in the dynamic memory device 32 and then is transferred or copied to the non-volatile memory device 34. Likewise, following the 100 hour and 1000 hour intervals, the contents of each of the time interval registers is stored in the dynamic memory device 32 and transferred or copied to the non-volatile memory device 34.

In response to detecting a "reset" signal following the 0.88 second time interval, the internal working memory time interval registers are set equal to zero and a delay is initiated. The delay is preferably in the vicinity of a 5 second time period, following which the "reset" signal is again tested. If the "reset" signal is no longer present following the delay, the zero contents of the 1/16th through 1000 hour registers is stored in the dynamic memory device 32 and the timing function continues as described above. Therefore, closing the switch 58 for a period less than the delay period, effectively resets the hourmeter to zero.

If the "reset" signal is detected following the delay period, the 1 hour and greater registers begin to increment at a reasonably rapid rate and the instant incremented value is responsively displayed on the display means 80. The "increment and display" process continues repetitively until the "reset" signal is no longer detected. At such time, the current value of the time interval registers is stored in the dynamic memory device 32. Therefore, in response to closing the switch 58 for a period greater than the delay period, a desired initial hourmeter setting is established for the apparatus 10. This may be desirable, for example, in the situation where the apparatus 10 is replaced in a vehicle that has accumulated a number of hours of service time. In such case, the new apparatus 10 can be initiated to the value of the removed hourmeter device.

It will be appreciated by those skilled in the art that it is not essential to incorporate all of the steps represented in the flowchart of FIGS. 4, 5, and 6 in a given system, nor is it necessary to implement the steps of FIGS. 4, 5, and 6 utilizing a microprocessor. However, such an implementation is deemed to be the best mode of practicing the invention owing to the broad and widespread availability of suitable microprocessor circuits, the widespread understanding of programming techniques for such microprocessors, the cost reduction in such circuitry which has been realized in recent years, and the flexibility afforded by such a programmable device.

Other aspects, objects, advantages and uses of this invention can be obtained from a study of the drawings, the disclosure, and the appended claims.

TABLE 1

| DECIMAL | BCD | GRAY CODE |
| --- | --- | --- |
| 0 | 0000 | 00000000 |
| 1 | 0001 | 00000001 |
| 2 | 0010 | 00000011 |
| 3 | 0011 | 00000111 |
| 4 | 0100 | 00001111 |
| 5 | 0101 | 00011111 |
| 6 | 0110 | 00111111 |
| 7 | 0111 | 01111111 |
| 8 | 1000 | 11111111 |
| 9 | 1001 | 11111110 |
| 10 | 1010 | 11111100 |
| 11 | 1011 | 11111000 |
| 12 | 1100 | 11110000 |
| 13 | 1101 | 11100000 |
| 14 | 1110 | 11000000 |
| 15 | 1111 | 10000000 |

What is claimed is:

1. Apparatus for measuring, storing and displaying the accumulated period of time an intermittent operating condition of a vehicle exists, comprising:

means for detecting said intermittent operating condition and producing a control signal in response to said detected condition;

oscillator means for producing a predetermined clock frequency signal;

a dynamic memory device having a plurality of addressable memory locations;

a non-volatile memory device having a plurality of addressable memory locations;

a plurality of time interval registers; and, processor means for receiving said control signal and said clock frequency signal, controllably modifying predetermined ones of said plurality of time interval registers in response to receiving both said control signal and a predetermined number of cycles of said clock frequency signal, storing a representation of the contents of said time interval registers in said dynamic memory device in response to each modification of a first predetermined one of said time interval registers, and transferring the contents of said dynamic memory device to said non-volatile memory device in response to each modification of a second predetermined one of said time interval registers.

2. Apparatus, as set forth in claim 1, wherein said vehicle includes a vehicle battery and said apparatus includes means for sensing the vehicle battery voltage and transferring the contents of said dynamic memory device to said non-volatile memory device in response to said vehicle battery voltage being less than a predetermined magnitude.

3. Apparatus, as set forth in claim 1, wherein a representation of the contents of at least a first one of said time interval registers is stored in both said dynamic and non-volatile memory devices as a binary coded decimal number, and a representation of the contents of at least a second one of said time interval registers is stored in both said dynamic and non-volatile memory devices as a gray coded binary number.

4. Apparatus, as set forth in claim 3, wherein the addressable memory location in which at least one of said gray coded binary numbers is stored is selected in response to the value of a predetermined different one of said stored numbers.

5. Apparatus, as set forth in claim 4, wherein the addressable memory location in which at least one of said gray coded binary numbers is stored varies systematically in response to said different one of said stored numbers.

6. Apparatus for measuring, storing and displaying the accumulated period of time an intermittent operating condition of a vehicle exists, comprising:
    means for detecting said intermittent operating condition and producing a control signal in response to said detected condition;
    oscillator means for producing a predetermined clock frequency signal;
    a non-volatile memory device having a plurality of addressable memory locations;
    a plurality of time interval registers, the contents of each of said time registers representing a different predetermined time interval; and,
    processor means for receiving said control signal and said clock frequency signal, accumulating the number of cycles of said clock frequency signal in said time interval registers in response to receiving both said control signal and said clock frequency signal, and periodically storing a binary coded decimal representation of the contents of at least a first one of said time registers and a gray coded representation of at least a second one of said time registers in said non-volatile memory device.

7. Apparatus, as set forth in claim 6, wherein said periodic storage occurs in response to the content of one of said time registers.

8. Apparatus, as set forth in claim 7, wherein said vehicle includes a vehicle battery and said apparatus includes means for sensing the vehicle battery voltage and storing said representations of the contents of said time interval registers in said non-volatile memory device in response to said vehicle battery voltage being less than a predetermined magnitude.

9. Apparatus, as set forth in claim 8, including means for controllably accessing and decoding the contents of said dynamic memory and displaying a number representing said decoded value.

10. An hourmeter for a vehicle, said vehicle having a vehicle battery, comprising:
    a switch connected to said battery;
    a first voltage regulator having an input terminal connected through said switch to said battery and an output terminal;
    a microprocessor having a plurality of input, output, and input/output ports, one of said input ports being connected to said voltage regulator output terminal;
    a dynamic random access memory device connected to one of said microprocessor input/output ports;
    a non-volatile random access memory device connected to said dynamic random access memory device and to said microprocessor; and,
    a digital display device connected to one of said microprocessor output ports.

11. An hourmeter, as set forth in claim 10, including a second voltage regulator having an input terminal connected to said vehicle battery and first and second output terminals, said first output terminal being connected to said non-volatile random access memory device; and,
    a voltage sensing circuit having a first input terminal connected to said voltage regulator second output terminal, a second input terminal connected to said vehicle battery, and an output terminal connected to said non-volatile random access memory device.

12. A method for measuring, storing and displaying the accumulated period of time an intermittent operating condition of a vehicle exists, said vehicle having a vehicle battery, comprising the steps of:
    detecting said intermittent operating condition and producing a control signal in response to said detected condition;
    producing a predetermined clock frequency signal;
    receiving said control signal and said clock frequency signal;
    modifying predetermined ones of a plurality of time interval registers in response to receiving both said control signal and a predetermined number of cycles of said clock frequency signal, storing a representation of the contents of said time interval registers in a dynamic memory device in response to each modification of a first predetermined one of said time interval registers; and,
    transferring the contents of said dynamic memory device to a non-volatile memory device in response to each modification of a second predetermined one of said time interval registers.

13. A method, as set forth in claim 12, including the steps of sensing the vehicle battery voltage and transferring the contents of said dynamic memory device to said non-volatile memory device in response to said vehicle battery voltage being less than a predetermined magnitude.

14. A method, as set forth in claim 12, including the steps of storing a representation of the contents of at least a first one of said time interval registers in both said dynamic and non-volatile memory devices as a binary coded decimal number, and storing a representation of the contents of at least a second one of said time interval registers in both said dynamic and non-volatile memory devices as a gray coded binary number.

* * * * *